(12) United States Patent
Shigematsu

(10) Patent No.: US 6,864,750 B2
(45) Date of Patent: Mar. 8, 2005

(54) CASCODE DISTRIBUTED AMPLIFIER

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 68 days.

(21) Appl. No.: 10/096,865

(22) Filed: Mar. 14, 2002

(65) Prior Publication Data

US 2003/0011436 A1 Jan. 16, 2003

(30) Foreign Application Priority Data

Jul. 11, 2001 (JP) ........................................ 2001-210672
Feb. 12, 2002 (JP) ........................................ 2002-034069

(51) Int. Cl.[7] ................................................. H03F 3/04
(52) U.S. Cl. ...................................... 330/311; 330/286
(58) Field of Search ................................. 330/286, 295, 330/302, 311, 124 R, 310

(56) References Cited

U.S. PATENT DOCUMENTS

| | | | | |
|---|---|---|---|---|
| 2,943,267 A | * | 6/1960 | Randise .......................... | 330/18 |
| 3,443,238 A | * | 5/1969 | Fynn et al. .................... | 330/18 |
| 4,559,503 A | * | 12/1985 | Camand et al. ............. | 330/302 |
| 5,196,805 A | | 3/1993 | Beckwith et al. ............. | 330/54 |
| 6,137,367 A | * | 10/2000 | Ezzedine et al. ........... | 330/311 |
| 6,400,226 B2 | * | 6/2002 | Sato .............................. | 330/286 |

OTHER PUBLICATIONS

J.P. Fraysse et al., "A 2W, High Efficiency, 2–8GHz, Cascode HBT MMIC Power Distributed Amplifier", 2000 IEEE MTT–S Digest, Jun. 11, 2000, pp. 529–532.

* cited by examiner

*Primary Examiner*—Henry Choe
(74) *Attorney, Agent, or Firm*—Arent Fox PLLC (57) ABSTRACT

In a cascode distributed amplifier of the present invention, a plurality of unit circuits are connected in parallel, and each unit circuit includes a pair of first and second transistors connected in series between an input transmission wire and an output transmission wire. The first transistor has a gate connected to the input transmission wire, a source grounded and a drain connected to the second transistor. The second transistor has a gate grounded, a source connected to the drain of the first transistor and a drain connected to the output transmission wire. Each unit circuit includes a damping resistor having a first end connected to the gate of the second transistor and a second end, and a capacitor having a first end connected to the second end of the damping resistor and a second end grounded.

15 Claims, 11 Drawing Sheets

5 stages

5 stages

CASCODE DISTRIBUTED AMPLIFIER

BACKGROUND OF THE INVENTION

1. Field of the Invention

The present invention relates to semiconductor circuits including transistors such as bipolar transistors or field-effect transistors. More specifically, the present invention relates to a cascode distributed amplifier in which a plurality of unit circuits, each including a grounded-gate transistor, are connected in parallel.

Recently, with the widespread proliferation of the Internet, the demand for a broadband transmission system capable of transmitting and receiving a large quantity of data at a high bit rate of 40 G b/s has increased. For this reason, there is also the demand for a broadband amplifier with a high frequency band of 40 GHz or above, which is one component of the broadband transmission system of the above type. In a transmitter of the broadband transmission system, a driver circuit is disposed at the front end the transmitter to drive a LN (lithium niobate) modulator. To obtain a high output voltage Vpp, ranging from 5 to 6 volts, and a good eye opening property, the driver circuit requires that it has a gain-raising characteristic to compensate for a loss of the LN modulator.

2. Description of the Related Art

It is known that a distributed amplifier provides a bandwidth depending on the arrangement of a ladder filter having the transistors with input capacitance and the transmission wires with inductance, and that the distributed amplifier is suitable for a broadband amplifier. In recent years, the major trend for such broadband amplifier is a cascode distributed amplifier in which a plurality of unit circuits each including a grounded-gate transistor are connected in parallel. The use of the cascode distributed amplifier allows generation of a negative-polarity resistance in a high frequency band by a circuit element connected to the grounded-gate transistor of each unit circuit, and provides broadband amplification.

Figure 1:
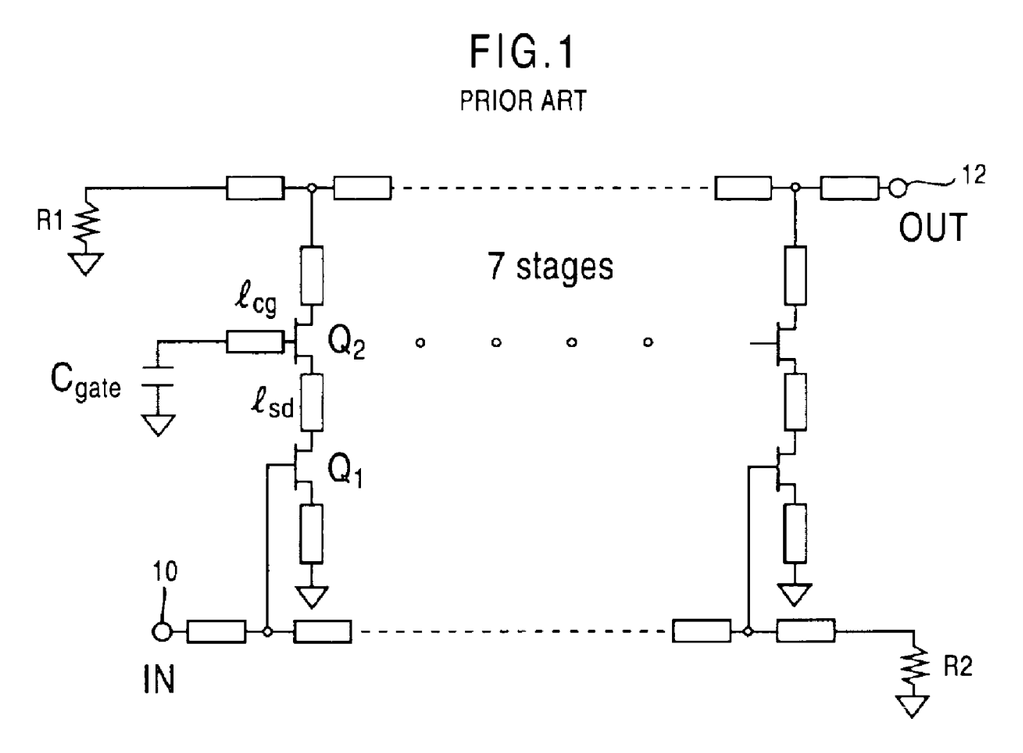
FIG. 1 is a circuit diagram of a conventional cascode distributed amplifier.

FIG. 1 is a circuit diagram of a conventional cascode distributed amplifier. The conventional cascode distributed amplifier in FIG. 1 is constructed by a plurality of unit circuits, each including a first transistor Q1 and a second transistor Q2, which are connected in parallel. Specifically, in the example shown in FIG. 1, seven unit circuits (or seven stages) are connected in parallel. An input signal IN is fed to an input terminal 10 at one end of an input-side transmission wire, and an amplified signal OUT generated by the distributed amplifier is supplied from an output terminal 12 at one end of an output-side transmission wire.

In FIG. 1, a resistor R1 is a termination resistor that is provided at the other end of the output-side transmission wire, and a resistor R2 is a termination resistor that is provided at the other end of the input-side transmission wire. Each of the rectangular blocks in FIG. 1 indicates an inductance component of one of the transmission wires or the unit circuits. The sign "∇" in FIG. 1 indicates that one end of the corresponding component such as a resistor, an inductor or a capacitor, is grounded.

In each of the plurality of unit circuits in the conventional cascode distributed amplifier in FIG. 1, the second transistor Q2 has a gate (called a grounded gate) which is grounded via an input capacitor $C_{gate}$. Further, an inductance component "$l_{cg}$" is connected in series between the input capacitor $C_{gate}$ and the gate of the second transistor Q2. The second transistor Q2 has a drain connected to the output-side transmission wire, and a source connected to a drain of the first transistor Q1. The first transistor Q1 has a gate which is connected to the input-side transmission wire. The first transistor Q1 has a source grounded, and a drain connected to the source of the second transistor Q2. Further, an inductance component "$l_{sd}$" is connected between the source of the second transistor Q2 and the drain of the first transistor Q1.

In amplifying operation of the conventional cascode distributed amplifier in FIG. 1, the first transistor Q1 of each unit circuit provides amplification of the input signal IN which is sent to the input terminal 10. The band of the amplification (or the frequency characteristics) of the conventional cascode distributed amplifier depends on the total inductance value of the inductors "$l_{sd}$" and "$l_{cg}$" at the first and second transistors Q1 and Q2 and the capacitance value of the input capacitor $C_{gate}$ at the gate of the second transistor Q2. The amplification gain of the conventional cascode distributed amplifier depends on the gain of the first transistor Q1 of each unit circuit.

In amplifying operation of the conventional cascode distributed amplifier in FIG. 1, the second transistor Q2 of each unit circuit provides generation of a negative-polarity resistance in a high frequency band. As the negative-polarity resistance allows the voltage gain to be increased (or providing a gain-raising characteristic), the conventional cascode distributed amplifier is effective in preventing the decreasing of the voltage gain in a high frequency band.

However, the conventional cascode distributed amplifier has the following problems.

Figure 2:
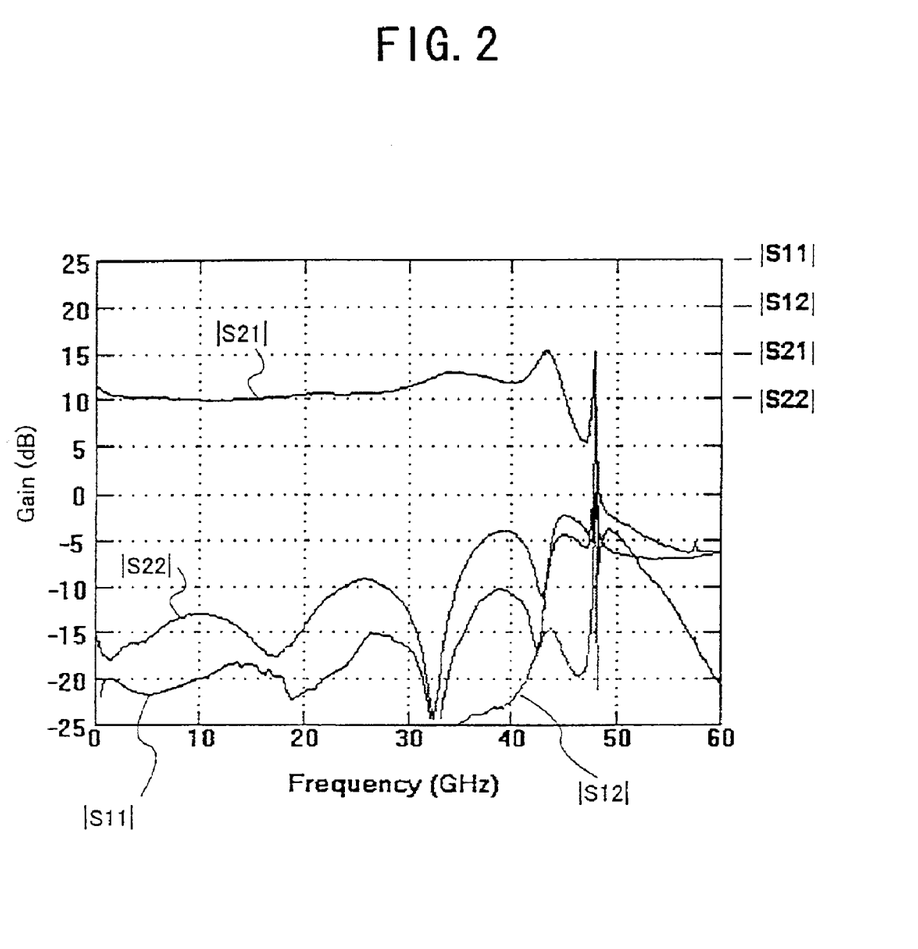
FIG. 2 is a diagram for explaining the frequency characteristics of the conventional distributed amplifier in FIG. 1.

FIG. 2 shows the frequency characteristics of the conventional cascode distributed amplifier in FIG. 1. In FIG. 2, the abscissas axis is the frequency axis (in GHz), and the ordinates axis is the gain axis (in dB). |S11| is the characteristic curve that indicates changes of a reflectance coefficient of the signal on the input-side transmission wire. |S22| is the characteristic curve that indicates changes of a reflectance coefficient of the signal on the output-side transmission wire. |S12| is the characteristic curve that indicates changes of an isolation of the output-side transmission signal with respect to the input-side transmission signal. |S21| is the characteristic curve that indicates changes of a gain coefficient (voltage gain) of the output signal to the input signal.

As shown in FIG. 2, the stability of the amplifying operation of the conventional cascode distributed amplifier deteriorates in the vicinity of the cut-off frequency of the ladder filter, which is near 50 GHz. Specifically, as indicated by the characteristic curve |S21| in FIG. 2, the voltage gain of the output signal to the input signal has a rapid increase (abnormal peaking) in the vicinity of the cutoff frequency of about 50 GHz. The peaking of the voltage gain occurs due to the negative-polarity resistance used in such a high frequency band. In other words, the negative-polarity resistance of the conventional cascode distributed amplifier is rapidly increased in the vicinity of the cut-off frequency, and the oscillation of the cascode distributed amplifier occurs at such frequency, which results in a rapid increase of the voltage gain of the output signal to the input signal. When the peaking of the voltage gain occurs, the eye pattern of the conventional cascode distributed amplifier deteriorates, and the possibility of a receiving error for the input signal is increased.

Further, in the conventional cascode distributed amplifier in FIG. 1, variations of the frequency characteristics of a subsequently connected circuit (for example, an LN modulator) due to changes of the manufacturing conditions thereof are not taken into consideration. If the frequency characteristics of the driver circuit for the LN modulator and the frequency characteristics of the LN modulator are not fitted to each other, each of the high level and the low level of the eye pattern has a certain width, and the error ratio of the signal transmitted by the transmission system is increased.

SUMMARY OF THE INVENTION

An object of the present invention is to provide an improved cascode distributed amplifier in which the above-described problems are eliminated.

Another object of the present invention is to provide a cascode distributed amplifier that provides stable amplifying operation even when the frequency of the input signal is in a high frequency range.

Another object of the present invention is to provide a cascode distributed amplifier that is capable of compensating for variations of the frequency characteristics of a subsequently connected circuit.

Another object of the present invention is to provide a transmission system including a cascode distributed amplifier that provides stable amplifying operation even when the frequency of the input signal is in a high frequency range.

The above-mentioned objects of the present invention are achieved by a cascode distributed amplifier comprising: single-phase cascode distributed amplifier including a plurality of unit circuits connected in parallel, each unit circuit comprising: a pair of first and second transistors which are connected in series between an input transmission wire and an output transmission wire, the first transistor having a gate connected to the input transmission wire, a source grounded and a drain connected to the second transistor, and the second transistor having a gate grounded, a source connected to the drain of the first transistor and a drain connected to the output transmission wire; a damping resistor which has a first end connected to the gate of the second transistor and a second end; and a capacitor which has a first end connected to the second end of the damping resistor and a second end grounded.

The above-mentioned objects of the present invention are achieved by a cascode distributed amplifier including a plurality of unit circuits connected in parallel, each unit circuit comprising: a pair of first and second transistors which are connected in series between an input transmission wire and an output transmission wire, the first transistor having a gate connected to the input transmission wire, a source grounded and a drain connected to the second transistor, and the second transistor having a gate grounded, a source connected to the drain of the first transistor and a drain connected to the output transmission wire; and a variable capacitor which has a first end connected to the gate of the second transistor and a second end grounded, the capacitor having a variable capacitance provided to compensate for variations of frequency characteristics of a subsequently connected circuit.

The above-mentioned objects of the present invention are achieved by a transmission system including a transmitter and a receiver that are connected via a transmission path, at least one of the transmitter and the receiver including a cascode distributed amplifier, the cascode distributed amplifier including a plurality of unit circuits connected in parallel, each unit circuit comprising: a pair of first and second transistors which are connected in series between an input transmission wire and an output transmission wire, the first transistor having a gate connected to the input transmission wire, a source grounded and a drain connected to the second transistor, and the second transistor having a gate grounded, a source connected to the drain of the first transistor and a drain connected to the output transmission wire; a damping resistor which has a first end connected to the gate of the second transistor and a second end; and a capacitor which has a first end connected to the second end of the damping resistor and a second end grounded.

In the cascode distributed amplifier of the present invention, the damping resistor is provided in each of the unit circuits and it prevents the rapid increase of the negative-polarity resistance in the high frequency range. By using the negative-polarity resistance, the cascode distributed amplifier provides stable amplifying operation even when the frequency of the input signal is in the high frequency range. Moreover, the variable capacitor having a variable capacitance is provided in each of the unit circuits. By changing a control voltage applied to the variable capacitor, the cascode distributed amplifier of the present invention compensates for variations of the frequency characteristics of a subsequently connected circuit.

BRIEF DESCRIPTION OF THE DRAWING

Other objects, features and advantages of the present invention will become apparent from the following detailed description when read in conjunction with the accompanying drawings.

DETAILED DESCRIPTION OF PREFERRED EMBODIMENTS

A description will now be provided of the preferred embodiments of the present invention with reference to the accompanying drawings.

Figure 3:
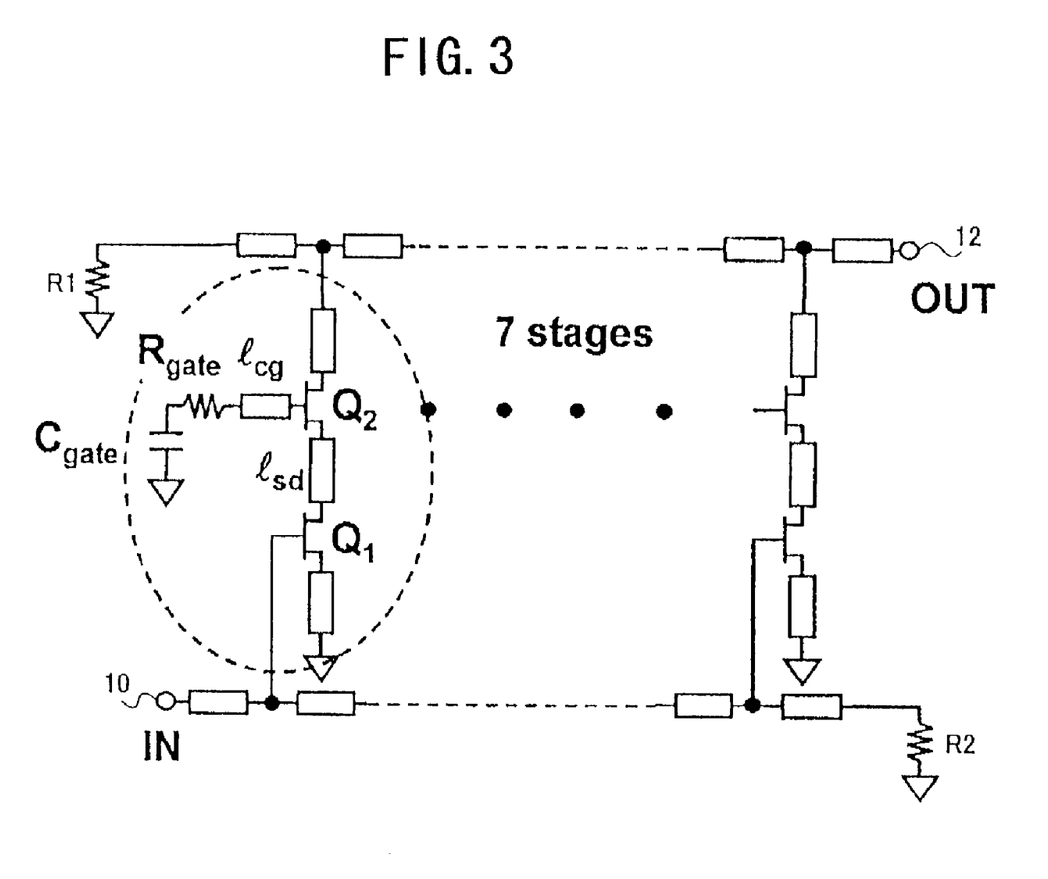
FIG. 3 is a circuit diagram of a single-phase cascode distributed amplifier according to a first preferred embodiment of the invention.

FIG. 3 shows a single-phase cascode distributed amplifier according to a first preferred embodiment of the invention. In FIG. 3, the elements that are essentially the same as corresponding elements in FIG. 1 are designated by the same reference numerals.

As shown in FIG. 3, the cascode distributed amplifier of the present embodiment is constructed by the plurality of unit circuits (in the example of FIG. 3, seven unit circuits), each including the first transistor Q1 and the second transistor Q2, and the plurality of unit circuits are connected in parallel. An input signal IN is supplied to the input terminal 10 at one end of the input-side transmission wire, and an amplified signal OUT generated by the distributed amplifier is supplied from the output terminal 12 at one end of the output-side transmission wire.

In FIG. 3, the resistor R1 is a termination resistor that is provided at the other end of the output-side transmission wire, and the resistor R2 is a termination resistor that is provided at the other end of the input-side transmission wire. Each of the rectangular blocks in FIG. 3 indicates an inductance component of a corresponding element of the transmission wires or the unit circuits. The sign "▽" in FIG. 3 indicates that one end of the corresponding component such as a resistor, an inductor or a capacitor, is grounded.

As indicated by the dotted-line circle in FIG. 3, in each of the plurality of unit circuits in the present embodiment, a damping resistor $R_{gate}$ is inserted between the grounding capacitor $C_{gate}$ and the inductance component $l_{cg}$ connected to the gate of the second transistor Q2 (called a grounded-gate transistor). Although FIG. 3 indicates that the damping resistor $R_{gate}$ is provided in the first-stage unit circuit only, the damping resistor $R_{gate}$ is provided in each of the seven unit circuits in the cascode distributed amplifier of the present embodiment of FIG. 3 in the same manner.

In each of the plurality of unit circuits in the present embodiment, the second transistor Q2 has a grounded gate which is grounded via the grounding capacitor $C_{gate}$. The inductance component "$l_{cg}$" which is connected at one end to the gate of the second transistor Q2, is connected at the other end to the damping resistor $R_{gate}$. The damping resistor $R_{gate}$, which is connected at one end to the inductance component "$l_{cg}$", is connected at the other to the grounding capacitor $C_{gate}$. The grounding capacitor $C_{gate}$, which is connected at one end to the damping resistor $R_{gate}$, is grounded at the other end. The second transistor Q2 has a drain which is connected to the output-side transmission wire via an inductance component, and has a source which is connected to a drain of the first transistor Q1 via an inductance component "$l_{sd}$". The first transistor Q1 has a gate which is connected to the input-side transmission wire. Moreover, the first transistor Q1 has a source which is grounded via an inductance component, and has a drain which is connected to the source of the second transistor Q2 via the inductance component "$l_{sd}$".

In amplifying operation of the cascode distributed amplifier in FIG. 3, the damping resistor $R_{gate}$ of each unit circuit acts to prevent the oscillation of the unit circuit. Specifically, the damping resistor $R_{gate}$ of each unit circuit acts to change the Q value of the unit circuit in the decreasing direction. In other words, the damping resistor $R_{gate}$ functions to reduce the sensitivity of the unit circuit to frequencies in the high frequency range. Accordingly, the cascode distributed amplifier of the present embodiment is effective in preventing the rapid increase of the voltage gain (or the negative-polarity resistance) in the high frequency range as in the conventional cascode distributed amplifier, and it is possible to provide stable amplifying operation even when the frequency of the input signal is in the high frequency range.

Figure 4:
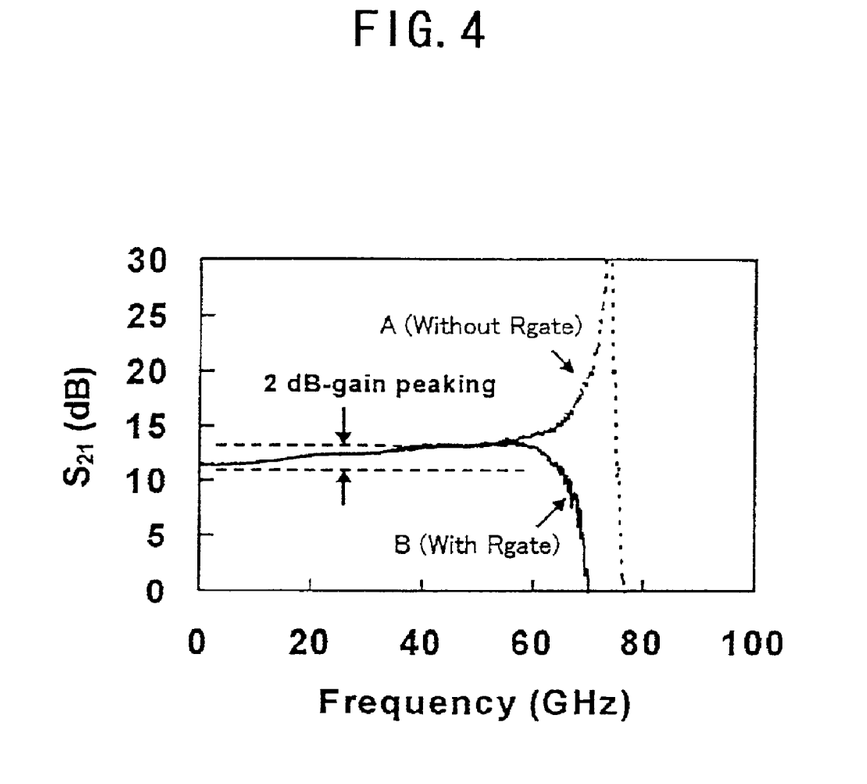
FIG. 4 is a diagram for explaining the distributed amplifier of the present embodiment in FIG. 3.

FIG. 4 shows the frequency characteristics of the distributed amplifier of the present embodiment in FIG. 3. In FIG. 4, the abscissas axis is the frequency axis (in GHz), and the ordinates axis indicates changes of the gain coefficient |S21| of the output signal to the input signal. Namely, the ordinates axis is the voltage gain axis (in dB). The characteristics curve of the cascode distributed amplifier of the present embodiment with the damping resistors $R_{gate}$ provided in the respective unit circuits is indicated by "B" in FIG. 4. For the sake of comparison, the characteristics curve of the conventional cascode distributed amplifier in FIG. 1 without the damping resistor $R_{gate}$ is indicated by "A" in FIG. 4.

As indicated by "A" in FIG. 4, the stability of the amplifying operation of the conventional cascode distributed amplifier deteriorates in the frequency range of 60 GHz or above. Specifically, as indicated by the characteristic curve A in FIG. 4, the voltage gain |S21| of the conventional amplifier has a rapid increase (abnormal peaking) in the frequency range of 60 GHz or above. On the other hand, as indicated by "B" in FIG. 4, the characteristic curve of the present embodiment shows that the voltage gain |S21| has no rapid increase in the frequency range of 60 GHz or above, although the cascode distributed amplifier of the present embodiment uses the negative-polarity resistance of the second transistor Q2 of each unit circuit. Accordingly, the cascode distributed amplifier of the present embodiment is effective in preventing the rapid increase of the negative-polarity resistance in the high frequency range as in the conventional cascode distributed amplifier, and it is possible to provide stable amplifying operation even when the frequency of the input signal is in the high frequency range. The cascode distributed amplifier of the present embodiment is effective in preventing the deterioration of the eye pattern at the receiving side, and it is possible to reduce the error ratio.

As in the characteristic curve "B" in FIG. 4, the voltage gain of the cascode distributed amplifier of the present embodiment in the frequency range of 0 GHz to 60 GHz is gradually increased by about 2 dB. Namely, the cascode distributed amplifier of the present embodiment has a gain-raising characteristic, which compensates for variations of the frequency characteristics of the subsequently connected circuit or the LN modulator.

The damping resistor $R_{gate}$ provided in each of the unit circuits of the cascode distributed amplifier of the present embodiment has a predetermined resistance value that is adequate for preventing the oscillation of each unit circuit in the high frequency range. For example, the damping resistor $R_{gate}$ has such a resistance value that makes the reflection coefficient |S11| or |S22| smaller than zero. If the reflection coefficient |S11| or |S22| is equal to or larger than zero, the oscillation of each unit circuit in the cascode distributed amplifier occurs.

The amplifier circuit of the present embodiment in FIG. 3 is constructed on a single semiconductor chip. In such a case, the damping resistor $R_{gate}$ is formed by an epitaxial resistor or a thin-film diffused resistor. It is difficult that the damping resistor $R_{gate}$, formed on a normal transmission wire, has the necessary resistance value, and it is necessary to provide the damping resistor $R_{gate}$ connected to an end of the transmission wire.

In the amplifier circuit of the present embodiment, the grounding capacitor $C_{gate}$ is formed by an thin-film capacitor, a diffused capacitor or a metal-oxide semiconductor (MOS) transistor.

In the above-described embodiment, the cascode distributed amplifier having the damping resistor $R_{gate}$ in each of the unit circuits prevents the rapid increase of the negative-polarity resistance in the high frequency range, and, by using the negative-polarity resistance, it provides stable amplifying operation even when the frequency of the input signal is in the high frequency range.

Figure 5:
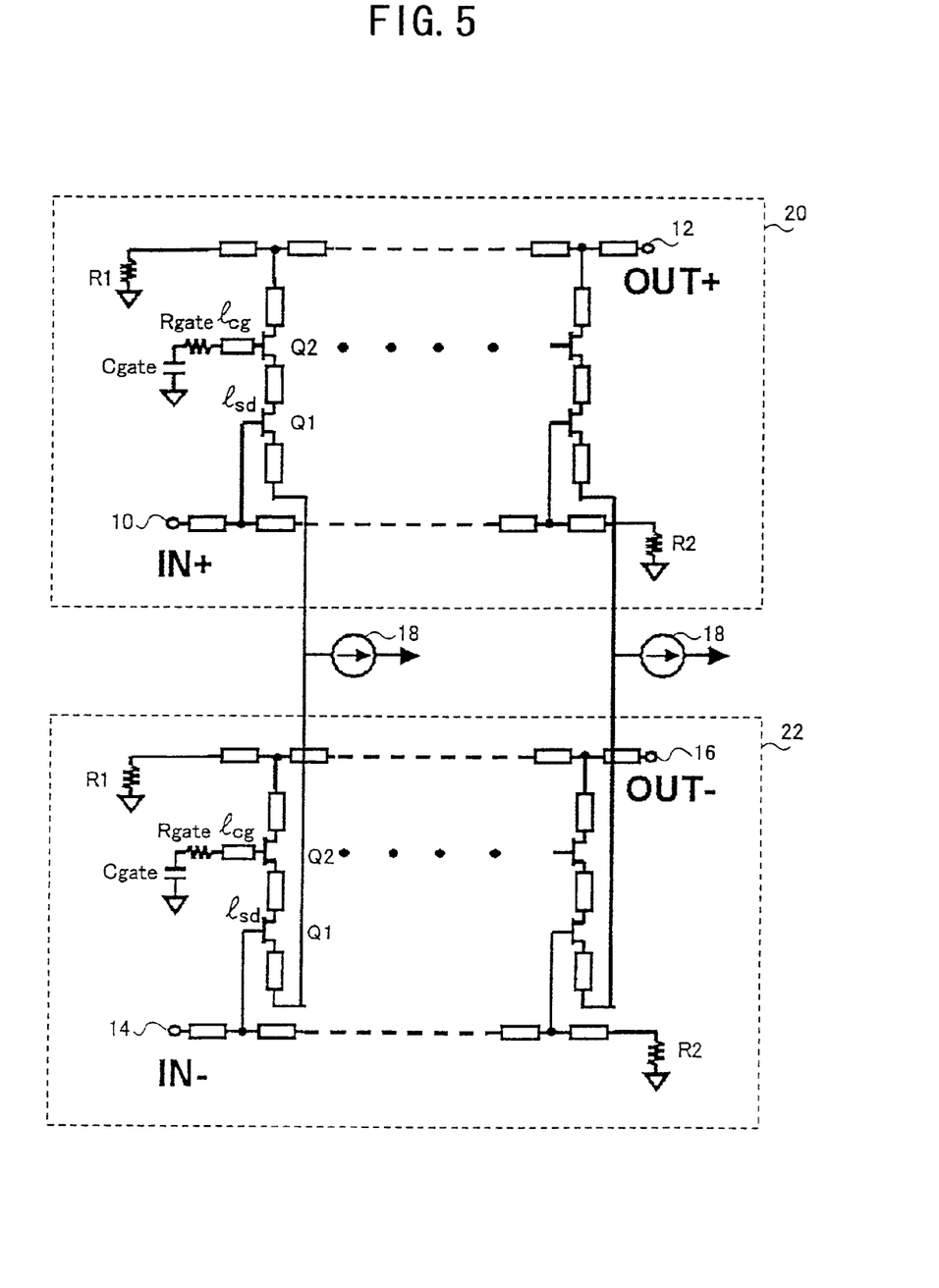
FIG. 5 is a circuit diagram of a dual-phase cascode distributed amplifier according to a second preferred embodiment of the invention.

FIG. 5 shows a dual-phase cascode distributed amplifier according to a second preferred embodiment of the invention. In FIG. 5, the elements that are essentially the same as corresponding elements in FIG. 3 are designated by the same reference numerals.

As shown in FIG. 5, the dual-phase cascode distributed amplifier of the present embodiment is constructed by two single-phase cascode distributed amplifiers 20 and 22 that are connected together via constant-current sources 18. The dual-phase cascode distributed amplifier of the present embodiment amplifies differential input signals IN+ and IN– received from input terminals 10 and 14, and supplies the amplified differential signals OUT+ and OUT– to output terminals 12 and 16.

Each of the single-phase cascode distributed amplifiers 20 and 22 has the configuration that is the same as the configuration of the cascode distributed amplifier shown in FIG. 3. Namely, in each of the cascode distributed amplifiers 20 and 22, a plurality of unit circuits, each including the first transistor Q1 and the second transistor Q2, are connected in parallel. Similar to the previous embodiment of FIG. 3, the damping resistor $R_{gate}$ is provided in each of the unit circuits in each of the cascode distributed amplifiers 20 and 22 of the present embodiment in the same manner. In each unit circuit, the damping resistor $R_{gate}$ is inserted between the grounding capacitor $C_{gate}$ and the inductance component $l_{cg}$ connected to the gate of the second transistor Q2. Other elements in the present embodiment of FIG. 5 are essentially the same as the corresponding elements in the previous embodiment of FIG. 3, and a description thereof will be omitted.

In the present embodiment in FIG. 5, the single-phase cascode distributed amplifiers 20 and 22, and the constant-current sources 18 are constructed on a single semiconductor chip.

Further, as shown in FIG. 5, in the present embodiment, the source of the first transistor Q1 of each of the unit circuits of the cascode distributed amplifier 20 and the source of the first transistor Q1 of each of the unit circuits of the cascode distributed amplifier 22 are connected together via the corresponding one of the constant-current sources 18. The electric current flowing into the source of the first transistor Q1 of each unit circuit is pulled into the corresponding one of the constant-current sources 18.

In amplifying operation of the dual-phase cascode distributed amplifier in FIG. 5, the differential input signals IN+ and IN– are respectively supplied to the input terminals 10 and 14 of the amplifiers 20 and 22, and the amplified differential signals OUT+ and OUT–, generated by the amplifiers 20 and 22, are respectively supplied from the output terminals 12 and 16 to inputs of a subsequently connected circuit.

In the above-described embodiment, each of the single-phase cascode distributed amplifiers 20 and 22 having the damping resistor $R_{gate}$ in each of the unit circuits prevents the rapid increase of the negative-polarity resistance in the high frequency range, and, by using the negative-polarity resistance, it provides stable amplifying operation even when the frequency of the input signal is in the high frequency range.

Figure 6:
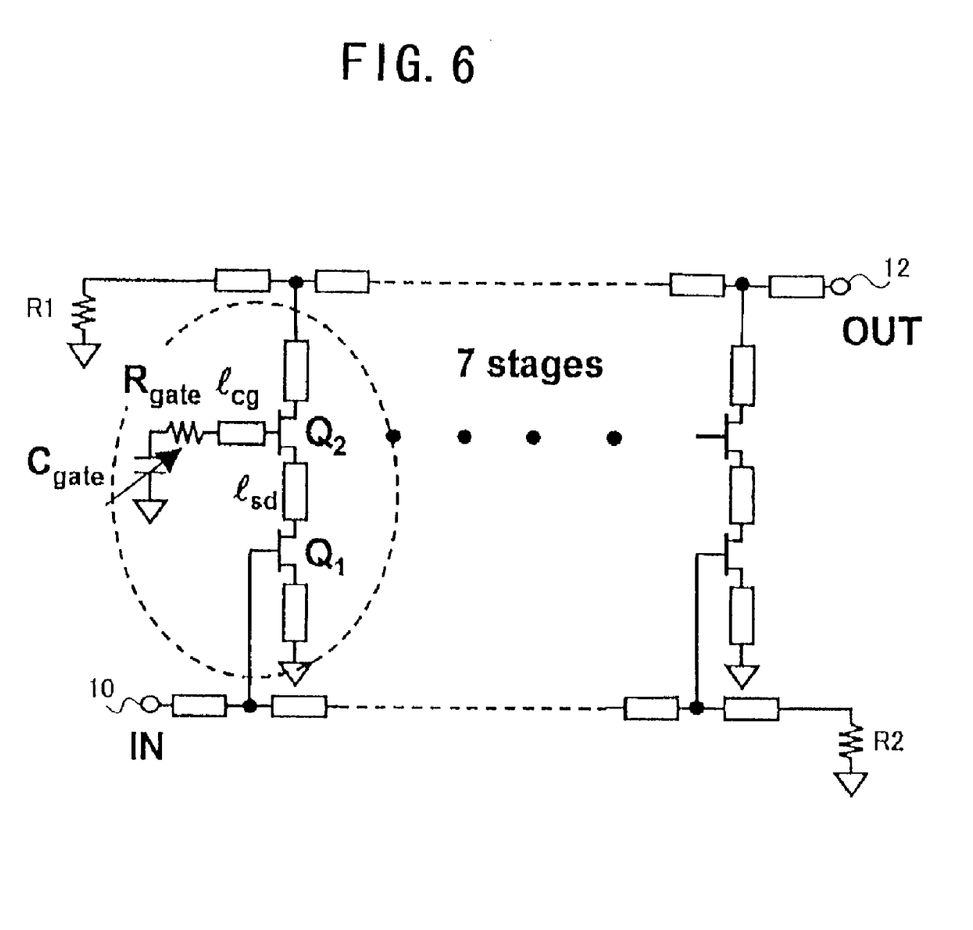
FIG. 6 is a circuit diagram of a single-phase cascode distributed amplifier according to a third preferred embodiment of the invention.

FIG. 6 shows a single-phase cascode distributed amplifier according to a third preferred embodiment of the invention. In FIG. 6, the elements that are essentially the same as corresponding elements in FIG. 3 are designated by the same reference numerals.

In the previous embodiments of FIG. 3 and FIG. 5, the grounding capacitor $C_{gate}$ has a fixed capacitance value. As shown in FIG. 6, the grounding capacitor $C_{gate}$ of the present embodiment has a variable capacitance value. For example, the grounding capacitor $C_{gate}$ of this type is constructed by using a varactor diode. Other elements in the present embodiment of FIG. 6 are essentially the same as the corresponding elements in the previous embodiment of FIG. 3, and a description thereof will be omitted.

In the cascode distributed amplifier of the present embodiment, a variable capacitance value provided by the grounding capacitor $C_{gate}$ is used, and it is possible to change the value of the negative-polarity resistance.

Figure 7:
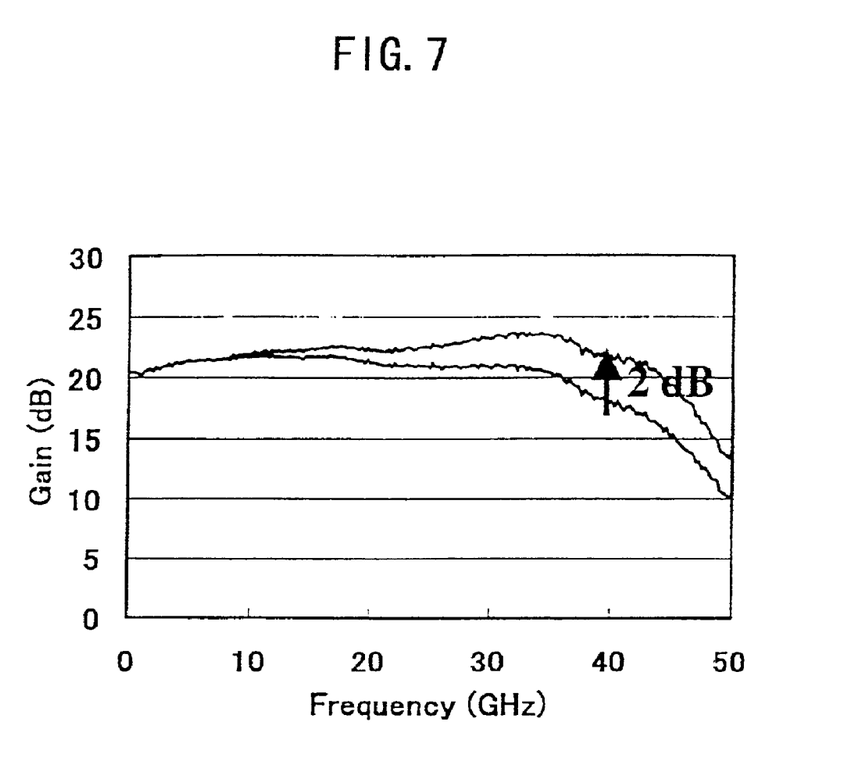
FIG. 7 is a diagram for explaining the frequency characteristics of the distributed amplifier of the present embodiment in FIG. 6.

FIG. 7 shows the frequency characteristics of the distributed amplifier of the present embodiment in FIG. 6 when a control voltage applied to the grounding capacitor $C_{gate}$ is changed.

As described above, in the present embodiment, the grounding capacitor $C_{gate}$ having a variable capacitance value is provided, and the grounding capacitor $C_{gate}$ is constructed by using a varactor diode. By changing the control voltage applied to the grounding capacitor $C_{gate}$ (the varactor diode), it is possible to change the capacitance value provided by the grounding capacitor $C_{gate}$.

As shown in FIG. 7, the cascode distributed amplifier of the present embodiment shows, when the capacitance value provided by the grounding capacitor $C_{gate}$ remain unchanged, the initial frequency characteristics indicated by the lower characteristic curve in FIG. 7. When the control voltage applied to the grounding capacitor $C_{gate}$ is changed so as to change the capacitance value provided by the grounding capacitor $C_{gate}$, the cascode distributed amplifier of the present embodiment shows the frequency characteristics indicated by the upper characteristic curve in FIG. 7. Thus, the cascode distributed amplifier of the present embodiment provides a gain-raising characteristic that amounts to 2 dB. By changing the control voltage applied to the grounding capacitor $C_{gate}$, in accordance with the frequency characteristics of a subsequently connected circuit (for example, an LN modulator), the cascode distributed amplifier of the present embodiment is able to compensate for variations of the frequency characteristics of the subsequently connected circuit due to changes of the manufacturing conditions. As a result, the output of the LN modulator provides flat frequency characteristics, and it is possible to obtain a good eye pattern.

When the amplifier circuit of FIG. 6 is formed on a semiconductor chip such that a control voltage is applied to the varactor diode, it is necessary that an external terminal to which the control voltage is supplied be provided on the chip. In such a case, the external terminal may be shared by the respective unit circuits of the amplifier.

As in the present embodiment of FIG. 6, it is preferred that both the damping resistor $R_{gate}$ and the variable grounding capacitor $C_{gate}$ be provided in the cascode distributed amplifier. However, it should be noted that, if the damping resistor $R_{gate}$ is omitted from the amplifier circuit shown in FIG. 6, the cascode distributed amplifier in such alternative embodiment provides the gain-raising characteristic shown in FIG. 7. However, the cascode distributed amplifier having no damping resistor $R_{gate}$ does not prevent the rapid increase of the voltage gain in the high frequency band of about 50 GHz as shown in FIG. 2, and the frequency band that can be suitably used by the cascode distributed amplifier in such alternative embodiment is restricted.

Further, the grounding capacitor $C_{gate}$ having a variable capacitance value (the varactor diode) may be provided in the dual-phase cascode distributed amplifier of FIG. 5. In such alternative embodiment, both the single-phase cascode distributed amplifiers 20 and 22 provide the gain-raising characteristic shown in FIG. 7. Hence, by suitably adjusting the capacitance value of the varactor diode, the dual-phase cascode distributed amplifier in such alternative embodiment is able to compensate for variations of the frequency characteristics of a subsequently connected circuit (for example, an LN modulator) connected to the output terminals 12 and 16 of the amplifiers 20 and 22. The external terminals, needed for applying the control voltage to the varactor diode, may be individually provided for the amplifiers 20 and 22. Alternatively, the external terminal which is shared by the amplifiers 20 and 22 may be provided.

Further, in the dual-phase cascode distributed amplifier in the above-mentioned embodiment, the damping resistor $R_{gate}$ may be omitted and only the variable grounding capacitor $C_{gate}$ may be provided. However, the dual-phase cascode distributed amplifier having no damping resistor $R_{gate}$ does not prevent the rapid increase of the voltage gain in the high frequency band of about 50 GHz as shown in FIG. 2, and the frequency band that can be suitably used by the cascode distributed amplifier in such alternative embodiment is restricted.

Figure 8:
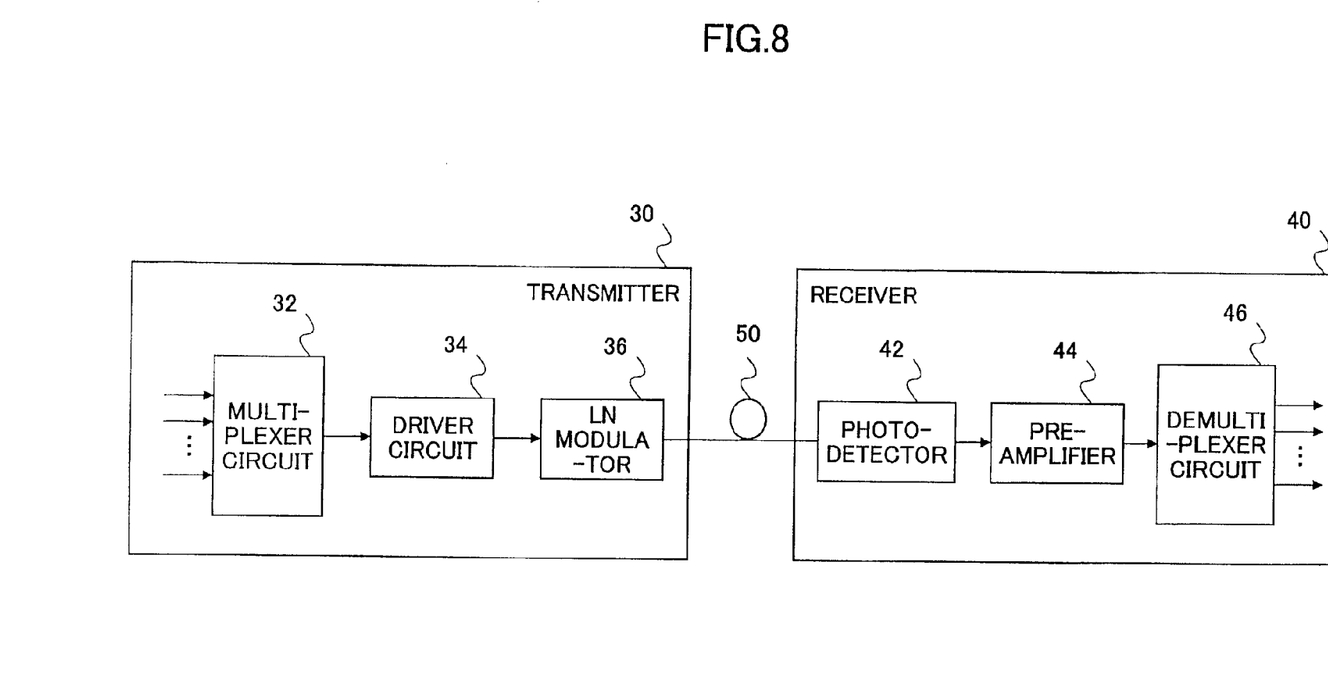
FIG. 8 is a block diagram of an optical transmission system including the cascode distributed amplifier of the invention.

FIG. 8 shows an optical transmission system in which the cascode distributed amplifier according to the present invention is provided.

As shown in FIG. 8, in the optical transmission system of the present embodiment, an optical transmitter 30 and an optical receiver 40 are connected together via an optical fiber cable 50. The transmitter 30 generally includes a multiplexer circuit 32, a driver circuit 34, and an LN (lithium niobate) modulator 36. In the transmitter 30, a signal output by an internal circuit (not shown) is sent to the multiplexer circuit 32, and the multiplexer circuit 32 generates a multiplexed signal from the received signal. In response to the multiplexed signal output by the multiplexer circuit 32, the driver circuit 34 generates a drive signal that is sent to the LN modulator 36. In response to the drive signal output by the driver circuit 34, the LN modulator 36 generates an optical modulated signal. The optical modulated signal output by the LN modulator is transmitted to the receiver 40 through the optical fiber cable 50. In the present embodiment, the cascode distributed amplifier of the present invention is incorporated in the driver circuit 34 of the transmitter 30.

In the transmission system in FIG. 8, the receiver 40 generally includes a photodetector 42, a pre-amplifier 44, and a demultiplexer circuit 46. In the receiver 40, the photodetector 42 receives the optical modulated signal from the optical fiber cable 50, and generates an electrical signal from the received optical signal. The pre-amplifier 44 provides amplification of the electrical signal output by the photodetector 42, and generates an amplified signal that is sent to the de-multiplexer circuit 46. In response to the amplified signal output by the pre-amplifier 44, the de-multiplexer circuit 46 generates a set of reconstructed signals from the received amplified signal. The reconstructed signals output by the de-multiplexer circuit 46 are sent to an internal circuit (not shown) of the receiver 40. In the present embodiment, the cascode distributed amplifier of the present invention is incorporated in the pre-amplifier 44 of the receiver 40.

Figure 9:
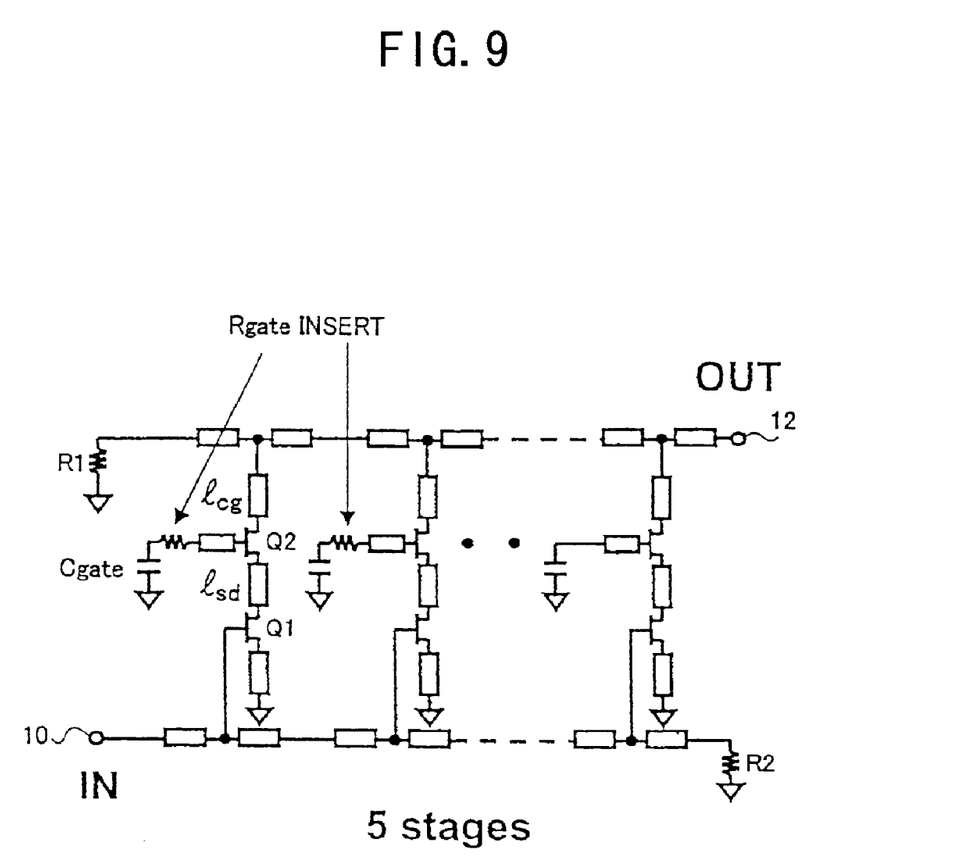
FIG. 9 is a circuit diagram of a single-phase cascode distributed amplifier according to a fourth preferred embodiment of the invention.

FIG. 9 shows a single-phase cascode distributed amplifier according to a fourth preferred embodiment of the invention. In FIG. 9, the elements that are essentially the same as corresponding elements in FIG. 3 are designated by the same reference numerals.

As shown in FIG. 9, the cascode distributed amplifier of the present embodiment is constructed by a plurality of unit circuits (in the example of FIG. 9, five unit circuits), each unit circuit including the first transistor Q1 and the second transistor Q2 connected in series between the input-side transmission wire and the output-side transmission wire, and the plurality of unit circuits are connected in parallel. An input signal IN is supplied to the input terminal 10 at one end of the input-side transmission wire, and an amplified signal OUT generated by the distributed amplifier is supplied from the output terminal 12 at one end of the output-side transmission wire.

In the present embodiment, two of the five unit circuits, which are located adjacent to the input terminal 10, include the damping resistor $R_{gate}$ that is provided between the grounding capacitor $C_{gate}$ and the inductance component $l_{cg}$ connected to the gate of the second transistor Q2. Other unit circuits than the above-mentioned two unit circuits do not include the damping resistor $R_{gate}$. The damping resistors $R_{gate}$ of the two unit circuits act to prevent the oscillation of the corresponding unit circuit. Specifically, the damping resistors $R_{gate}$ act to change the Q value of the corresponding unit circuit in the decreasing direction. In other words, the damping resistors $R_{gate}$ function to reduce the sensitivity of the unit circuit to frequencies in the high frequency range. Accordingly, the cascode distributed amplifier of the present embodiment is effective in preventing the rapid increase of the voltage gain (or the negative-polarity resistance) in the high frequency range as in the conventional cascode distributed amplifier, and it is possible to provide stable amplifying operation even when the frequency of the input signal is in the high frequency range.

Figure 10:
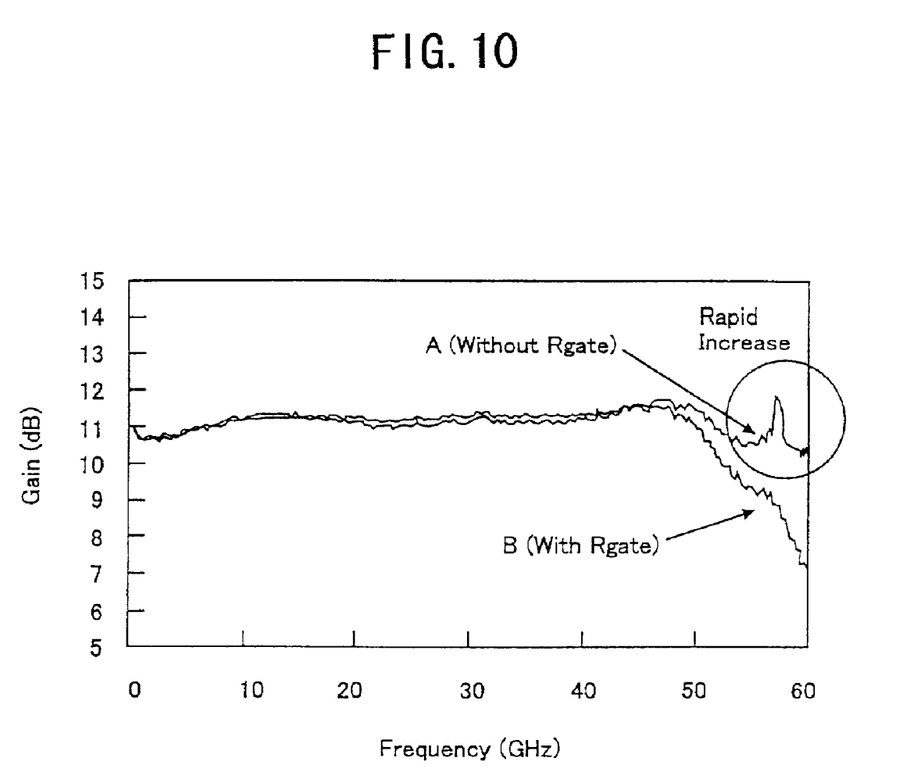
FIG. 10 is a diagram for explaining the frequency characteristics of the distributed amplifier of the present embodiment in FIG. 9.

FIG. 10 shows the frequency characteristics of the distributed amplifier of the present embodiment in FIG. 9. In FIG. 10, the abscissas axis is the frequency axis (in GHz), and the ordinates axis indicates changes of the voltage gain of the output signal to the input signal. Namely, the ordinates axis is the voltage gain axis (in dB). The characteristic curve of the cascode distributed amplifier of the present embodiment having the damping resistors $R_{gate}$ provided in the two unit circuits adjacent to the input terminal 10 is indicated by "B" in FIG. 10. For the sake of comparison, the characteristics curve of the conventional cascode distributed amplifier in FIG. 1 having no damping resistor $R_{gate}$ is indicated by "A" in FIG. 10.

As indicated by "A" in FIG. 10, the stability of the amplifying operation of the conventional amplifier deteriorates in the frequency range of 60 GHz or less. Specifically, as indicated by the characteristic curve A in FIG. 10, the voltage gain of the conventional amplifier has a rapid increase (abnormal peaking) in the frequency range of 60 GHz or less. On the other hand, as indicated by "B" in FIG. 10, the characteristic curve of the present embodiment shows a gradual decrease of the voltage gain in the frequency range of 60 GHz or less, and no rapid gain increase takes place. Accordingly, the cascode distributed amplifier of the present embodiment is effective in preventing the rapid increase of the negative-polarity resistance in the high frequency range as in the conventional amplifier, and it is possible to provide stable amplifying operation even when the frequency of the input signal is in the high frequency range.

In the amplifier circuit shown in FIG. 9, the damping resistors $R_{gate}$ are provided only in the two unit circuits which are located adjacent to the input terminal 10 in the cascode distributed amplifier. Alternatively, the damping resistors $R_{gate}$ may be provided in two or more unit circuits located adjacent to the input terminal 10. In such alternative embodiment, it is possible to strengthen the effects of providing stable amplifying operation.

Further, instead of the fourth preferred embodiment of FIG. 9, the damping resistors $R_{gate}$ may be provided in the two unit circuits which are located adjacent to the output terminal 12 in the cascode distributed amplifier, which will be described below.

Figure 11:
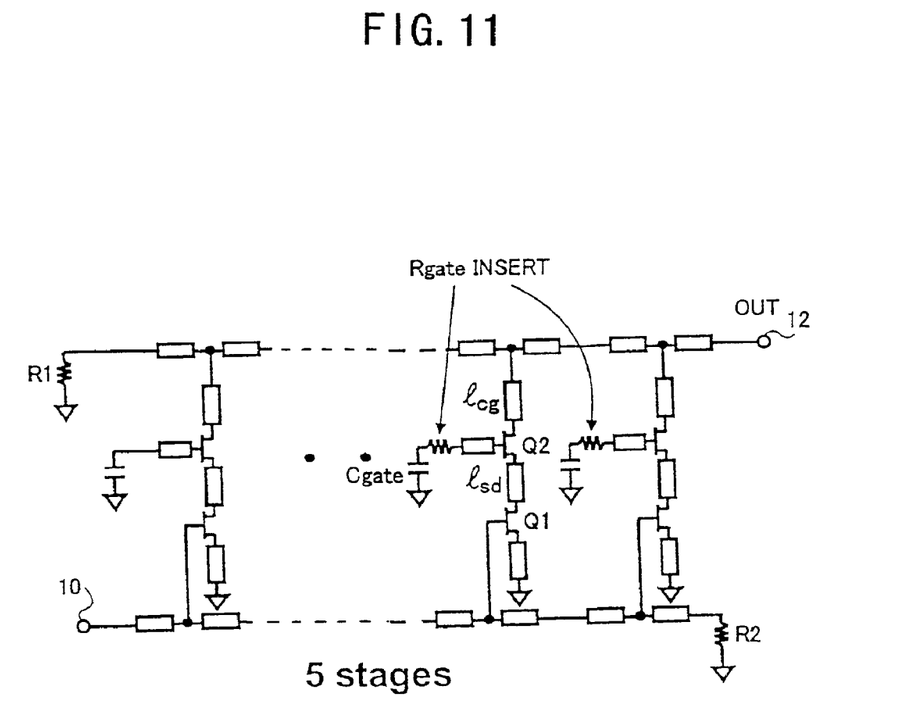
FIG. 11 is a circuit diagram of a single-phase cascode distributed amplifier according to a fifth preferred embodiment of the invention.

FIG. 11 shows a single-phase cascode distributed amplifier according to a fifth preferred embodiment of the invention. In FIG. 11, the elements that are essentially the same as corresponding elements in FIG. 3 are designated by the same reference numerals.

As shown in FIG. 11, the cascode distributed amplifier of the present embodiment is constructed by a plurality of unit circuits (in the example of FIG. 11, five unit circuits), each unit circuit including the first transistor Q1 and the second transistor Q2 connected in series between the input-side transmission wire and the output-side transmission wire, and the plurality of unit circuits are connected in parallel. An input signal IN is supplied to the input terminal 10 at one end of the input-side transmission wire, and an amplified signal OUT generated by the distributed amplifier is supplied from the output terminal 12 at one end of the output-side transmission wire.

In the cascode distributed amplifier in FIG. 11, two of the five unit circuits, which are located adjacent to the output terminal 12, include the damping resistor $R_{gate}$ that is provided between the grounding capacitor $C_{gate}$ and the inductance component $l_{cg}$ connected to the gate of the second transistor Q2. Other unit circuits than the above-mentioned two unit circuits do not include the damping resistor $R_{gate}$.

Similar to the previous embodiment of FIG. 9, in the present embodiment, the damping resistors $R_{gate}$ of the two unit circuits act to prevent the oscillation of the corresponding unit circuit. Specifically, the damping resistors $R_{gate}$ act to change the Q value of the corresponding unit circuit in the decreasing direction. In other words, the damping resistors $R_{gate}$ function to reduce the sensitivity of the unit circuit to frequencies in the high frequency range. Accordingly, the cascode distributed amplifier of the present embodiment is effective in preventing the rapid increase of the voltage gain (or the negative-polarity resistance) in the high frequency range as in the conventional cascode distributed amplifier, and it is possible to provide stable amplifying operation even when the frequency of the input signal is in the high frequency range.

In addition, similar to the previous embodiment of FIG. 5, a dual-phase cascode distributed amplifier can be constructed by connecting a first single-phase cascode distributed amplifier 20 and a second single-phase cascode distributed amplifier 22 which are configured according to the embodiment of FIG. 9 or the embodiment of FIG. 11. Specifically, in the dual-phase cascode distributed amplifier of such alternative embodiment, the two of the five unit circuits in the amplifier 20, located adjacent to the input terminal 10, and the two of the five unit circuits in the amplifier 22, located adjacent to the input terminal 14, include the damping resistors $R_{gate}$ that are provided between the grounding capacitor $C_{gate}$ and the inductance component $l_{cg}$ connected to the gate of the second transistor Q2. Other unit circuits than the above-mentioned unit circuits do not include the damping resistor $R_{gate}$.

Alternatively, in the dual-phase cascode distributed amplifier of such alternative embodiment, the two of the five unit circuits in the amplifier 20, located adjacent to the output terminal 12, and the two of the five unit circuits in the amplifier 22, located adjacent to the output terminal 16, may include the damping resistors $R_{gate}$.

In the above-described embodiments, it is assumed that the cascode distributed amplifier employs field-effect transistors (FET) as the first and second transistors Q1 and Q2. Alternatively, the cascode distributed amplifier of the present invention may employ bipolar junction transistors (BJT) as the first and second transistors Q1 and Q2. In such alternative embodiment, the objects, features and advantages of the invention that are essentially the same as those of the above-described embodiments can be achieved.

Further, in the above-described embodiments, the five or seven unit circuits are connected in parallel within the single-phase cascode distributed amplifier. However, the present invention is not limited to these embodiments. It is readily understood that an arbitrary number of unit circuits may be provided within the single-phase cascode distributed amplifier without departing from the scope of the present invention.

Moreover, the cascode distributed amplifier of the invention may be configured such that the damping resistor $R_{gate}$ of each unit circuit has a variable resistance value. The appropriate value of the resistance provided by the damping resistor $R_{gate}$ may be determined through experimental computer simulations, for example. However, the use of the damping resistor $R_{gate}$ having a variable resistance value is not always needed. In some circumstances, the demands of the users for the desired frequency characteristics of the amplifier may be satisfied by the use of the damping resistor $R_{gate}$ having a variable resistance value. For example, a terminal used to adjust the variable resistance of the damping resistor $R_{gate}$ is provided on a chip, and, by changing a control voltage supplied to the terminal of the chip, the adjustment of the variable resistance of the damping resistor $R_{gate}$ to the desired value can be realized.

Further, in the embodiment of FIG. 8, the cascode distributed amplifier of the present invention is provided in an optical transmission system. Alternatively, the cascode distributed amplifier of the present invention may be provided in another transmission system.

The present invention is not limited to the above-described embodiments, and variations and modifications may be made without departing from the scope of the present invention.

Further, the present invention is based on Japanese priority application No. 2001-210672, filed on Jul. 11, 2001, and Japanese priority application No. 2002-34069, filed on Feb. 12, 2002, the entire contents of which are hereby incorporated by reference.

What is claimed is:

1. A single-phase cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire;

a damping resistor having a first end connected to the gate of the second field-effect transistor and a second end, the damping resistor prevents a rapid increase of a negative-polarity resistance of the second field-effect transistor in a high frequency range where oscillation of the amplifier tends to occur; and a capacitor having a first end connected to the second end of the damping resistor and a second end grounded.

2. A single-phase cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire;

a variable capacitor having a first end and a second end grounded, the capacitor having a variable capacitance provided to compensate for variations of frequency characteristics of a subsequently connected circuit; and a damping resistor having a first end connected to the gate of the second field-effect transistor and a second end connected to the first end of the variable capacitor, the damping resistor prevents a rapid increase of a negative-polarity resistance of the second field-effect transistor in a high frequency range where oscillation of the amplifier tends to occur.

3. A dual-phase cascode distributed amplifier including a first single-phase cascode distributed amplifier and a second single-phase cascode distributed amplifier that are connected together, each single-phase cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire;

a damping resistor having a first end connected to the gate of the second field-effect transistor and a second end, the damping resistor prevents a rapid increase of a negative-polarity resistance of the second field-effect transistor in a high frequency range where oscillation of the amplifier tends to occur; and a capacitor having a first end connected to the second end of the damping resistor and a second end grounded.

4. A dual-phase cascode distributed amplifier including a first single-phase cascode distributed amplifier and a second single-phase cascode distributed amplifier that are connected together, each single-phase cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire;

a variable capacitor having a first end and a second end grounded, the capacitor having a variable capacitance provided to compensate for variations of frequency characteristics of a subsequently connected circuit; and a damping resistor having a first end connected to the gate of the second field-effect transistor and a second end connected to the first end of the variable capacitor, the damping resistor prevents a rapid increase of a negative-polarity resistance of the second field-effect transistor in a high frequency range where oscillation of the amplifier tends to occur.

5. The cascode distributed amplifier of claim 1, wherein the cascode distributed amplifier receives an input signal from an input terminal at one end of the input transmission wire and supplies an amplified signal to an output terminal at one end of the output transmission wire.

6. A transmission system including a transmitter and a receiver that are connected via a transmission path, at least one of the transmitter and the receiver including a cascode distributed amplifier, the cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire;

a damping resistor having a first end connected to the gate of the second field-effect transistor and a second end, the damping resistor prevents a rapid increase of a negative-polarity resistance of the second field-effect transistor in a high frequency range where oscillation of the amplifier tends to occur; and a capacitor having a first end connected to the second end of the damping resistor and a second end grounded.

7. A single-phase cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire; and a capacitor having a first end connected to the gate of the second field-effect transistor and a second end grounded, wherein each of at least two unit circuits among the plurality of unit circuits further includes a damping resistor provided between the second field-effect transistor and the capacitor, the damping resistor having a first end connected to the gate of the second field-effect transistor and a second end connected to the first end of the capacitor, the damping resistor prevents a rapid increase of a negative-polarity resistance of the second field-effect transistor in a high frequency range where oscillation of the amplifier tends to occur.

8. A dual-phase cascode distributed amplifier including a first single-phase cascode distributed amplifier and a second single-phase cascode distributed amplifier that are connected together, each single-phase cascode distributed amplifier including a plurality of unit circuits connected in parallel, each unit circuit comprising:

a pair of first and second field-effect transistors connected in series between an input transmission wire and an output transmission wire, the first field-effect transistor having a gate connected to the input transmission wire, a source grounded and a drain connected to the second field-effect transistor, and the second field-effect transistor having a gate grounded, a source connected to the drain of the first field-effect transistor and a drain connected to the output transmission wire; and a capacitor having a first end connected to the gate of the second field-effect transistor and a second end grounded, wherein each of at least two unit circuits among the plurality of unit circuits further includes a damping resistor provided between the second field-effect transistor and the capacitor, the damping resistor having a first end connected to the gate of the second field-effect transistor and a second end connected to the first end of the capacitor, the damping resistor prevents a rapid increase of a negative-polarity resistance of the second field-effect transistor in a high frequency range where oscillation of the amplifier tends to occur.

9. The cascode distributed amplifier of claim 7, wherein said at least two unit circuits, each including the damping resistor, are located adjacent to an input terminal of the cascode distributed amplifier.

10. The cascode distributed amplifier of claim 7, wherein said at least two unit circuits, each including the damping resistor, are located adjacent to an output terminal of the cascode distributed amplifier.

11. The cascode distributed amplifier of claim 8, wherein said at least two unit circuits, each including the damping resistor, are located adjacent to an input terminal of the cascode distributed amplifier.

12. The cascode distributed amplifier of claim 8, wherein said at least two unit circuits, each including the damping resistor, are located adjacent to an output terminal of the cascode distributed amplifier.

13. The cascode distributed amplifier of claim 1, wherein the high frequency range in which the amplifier operates is above 40 GHz.

14. The cascode distributed amplifier of claim 2 wherein said variable capacitor is constructed by using a varactor diode.

15. The cascode distributed amplifier of claim 4, wherein said variable capacitor is constructed by using a varactor diode.

* * * * *